(12) United States Patent
Binder

(10) Patent No.: US 11,150,260 B2
(45) Date of Patent: Oct. 19, 2021

(54) SENSOR DEVICES AND METHODS FOR PRODUCING SENSOR DEVICES

(71) Applicant: Infineon Technologies AG, Neubiberg (DE)

(72) Inventor: Gernot Binder, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 16/428,135

(22) Filed: May 31, 2019

(65) Prior Publication Data

US 2020/0003797 A1 Jan. 2, 2020

(30) Foreign Application Priority Data

Jun. 28, 2018 (DE) .......................... 102018210595.2

(51) Int. Cl.
*G01R 33/02* (2006.01)
*G01P 3/44* (2006.01)

(52) U.S. Cl.
CPC ................ *G01P 3/44* (2013.01); *G01R 33/02* (2013.01)

(58) Field of Classification Search
CPC ......... G01P 3/44; G01P 3/488; G01R 33/038; G01R 33/072; G01R 33/091; G01D 5/145; G01D 5/147; G01D 5/165; G01D 5/1655

See application file for complete search history.

(56) References Cited

U.S. PATENT DOCUMENTS

| | | | | |
|---|---|---|---|---|
| 3,980,913 A | * | 9/1976 | Peterson | G01P 3/488 310/155 |
| 4,506,217 A | * | 3/1985 | Rothley | G01P 3/488 324/174 |
| 4,727,323 A | * | 2/1988 | Zabler | G01R 33/09 324/207.18 |
| 4,859,941 A | * | 8/1989 | Higgs | H03K 17/9517 324/207.2 |
| 5,041,784 A | * | 8/1991 | Griebeler | G01P 3/488 324/207.21 |
| 5,084,674 A | * | 1/1992 | Lachmann | G01P 3/488 324/166 |

(Continued)

FOREIGN PATENT DOCUMENTS

| | | |
|---|---|---|
| CN | 101243326 A | 8/2008 |
| CN | 101680777 A | 3/2010 |

(Continued)

OTHER PUBLICATIONS

Orienting Bar Magnets to Operate Magnetic Sensors, docstuve.com, pp. 1-2 (Year: 2017).*

*Primary Examiner* — Patrick Assouad
*Assistant Examiner* — Demetrius R Pretlow
(74) *Attorney, Agent, or Firm* — Harrity & Harrity, LLP

(57) ABSTRACT

A sensor device comprises a magnet having a magnetization in a first direction. Furthermore, the sensor device comprises a differential magnetic field sensor arranged on the magnet and having a first sensor element and a second sensor element, wherein the sensor elements are spaced apart in a second direction perpendicular to the first direction. The first sensor element and the second sensor element are designed to detect a magnetic field component in a third direction perpendicular to the first direction and perpendicular to the second direction.

20 Claims, 14 Drawing Sheets

(56) References Cited

U.S. PATENT DOCUMENTS

| | | | | |
|---|---|---|---|---|
| 5,596,272 A * | 1/1997 | Busch | G01D 5/147 324/174 |
| 5,614,821 A * | 3/1997 | Leiderer | G01D 5/142 324/174 |
| 5,854,572 A * | 12/1998 | Aoyama | G01P 3/488 330/282 |
| 6,100,682 A * | 8/2000 | Schroeder | G01B 7/30 324/207.21 |
| 6,232,770 B1 * | 5/2001 | Schroeder | G01D 5/147 324/207.12 |
| 6,310,475 B1 * | 10/2001 | Kawase | G01D 5/145 194/317 |
| 6,323,642 B1 * | 11/2001 | Nishimura | G01D 5/147 257/E21.514 |
| 6,498,474 B1 * | 12/2002 | Turner | G01D 5/145 324/165 |
| 9,080,896 B2 * | 7/2015 | Wallrafen | G01D 5/24476 |
| 10,012,518 B2 * | 7/2018 | David | G01D 5/142 |
| 10,539,432 B2 | 1/2020 | Binder | |
| 2003/0141864 A1 * | 7/2003 | Babin | G01P 21/02 324/207.12 |
| 2003/0173955 A1 * | 9/2003 | Uenoyama | G01D 5/24476 324/207.21 |
| 2003/0222642 A1 * | 12/2003 | Butzmann | G01R 33/07 324/207.21 |
| 2003/0231013 A1 * | 12/2003 | Faymon | G01P 3/488 324/166 |
| 2004/0085061 A1 * | 5/2004 | Busch | G01D 5/147 324/207.2 |
| 2005/0258820 A1 * | 11/2005 | Forster | G01D 5/2451 324/165 |
| 2006/0082364 A1 * | 4/2006 | Kurumado | G01D 5/147 324/207.21 |
| 2006/0181269 A1 * | 8/2006 | Takeuchi | G01P 3/488 324/173 |
| 2006/0261801 A1 | 11/2006 | Busch et al. | |
| 2007/0200561 A1 * | 8/2007 | Yokotani | G01P 13/045 324/207.22 |
| 2007/0273365 A1 * | 11/2007 | Lanter | B60R 22/48 324/207.2 |
| 2009/0146647 A1 * | 6/2009 | Ausserlechner | G01D 5/145 324/207.21 |
| 2009/0295382 A1 * | 12/2009 | Sterling | G01R 33/091 324/252 |
| 2011/0260724 A1 * | 10/2011 | Tatenuma | G01P 3/481 324/252 |
| 2011/0291645 A1 * | 12/2011 | Franke | G01D 5/145 324/207.2 |
| 2014/0333299 A1 * | 11/2014 | Heberle | G01R 33/0011 324/228 |
| 2015/0073677 A1 * | 3/2015 | Kretschmann | B60T 8/171 701/71 |
| 2016/0003923 A1 * | 1/2016 | Zieren | H01L 43/08 324/252 |
| 2016/0041006 A1 * | 2/2016 | Ausserlechner | G01R 33/077 324/207.2 |
| 2016/0123771 A1 | 5/2016 | David et al. | |
| 2016/0363637 A1 * | 12/2016 | Franke | G01R 33/07 |
| 2017/0102250 A1 * | 4/2017 | Franke | G01D 5/147 |
| 2017/0356762 A1 * | 12/2017 | David | G01D 5/147 |
| 2018/0031392 A1 * | 2/2018 | Yoshiya | G01D 5/245 |
| 2018/0031643 A1 * | 2/2018 | Kaufmann | G01R 33/0005 |
| 2018/0364066 A1 * | 12/2018 | Satz | G01R 33/09 |
| 2019/0085875 A1 * | 3/2019 | Slama | F15B 15/2861 |
| 2020/0182899 A1 * | 6/2020 | Fricke | G01P 3/488 |

FOREIGN PATENT DOCUMENTS

| | | |
|---|---|---|
| CN | 101696979 A | 4/2010 |
| CN | 110095140 A | 8/2019 |
| DE | 102012201348 A1 | 8/2012 |
| DE | 102015007190 A1 | 12/2016 |
| DE | 102007023815 A1 | 11/2018 |

* cited by examiner

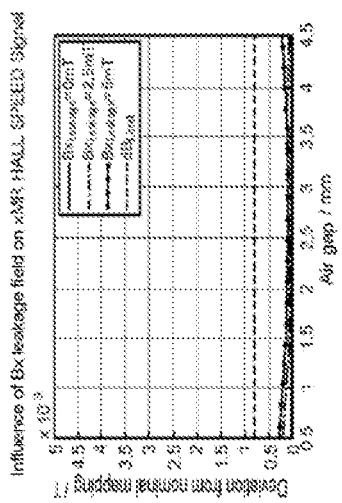
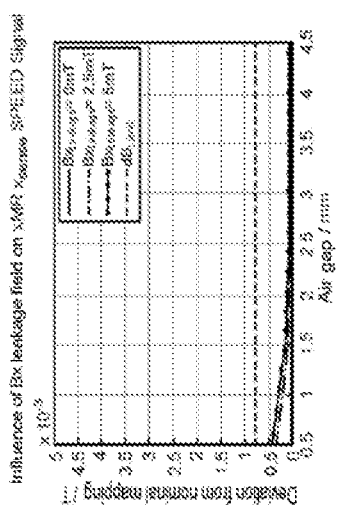
Fig. 13A  Fig. 13B  Fig. 13C

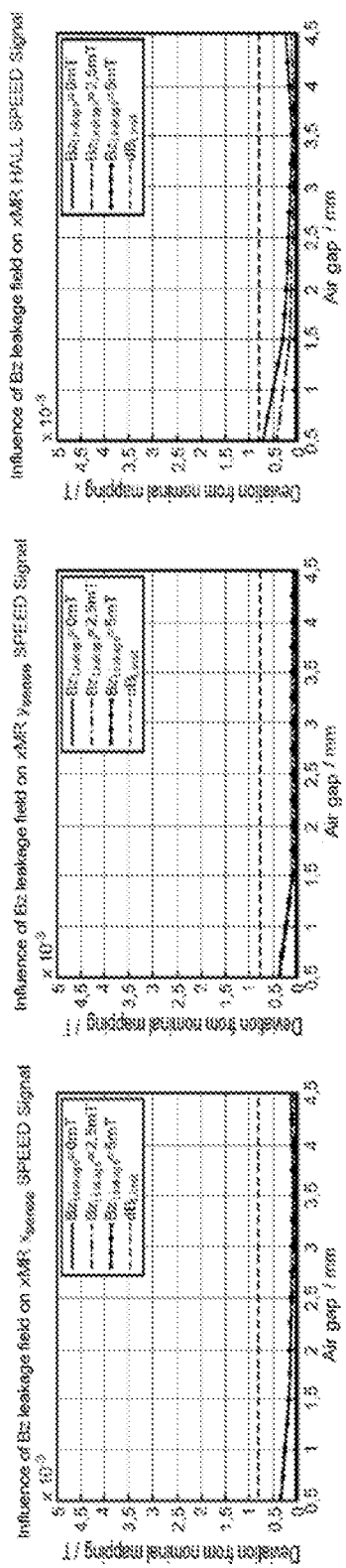

SENSOR DEVICES AND METHODS FOR PRODUCING SENSOR DEVICES

CROSS REFERENCE TO RELATED APPLICATION

This application claims priority under 35 U.S.C. § 119 to German Patent Application No. 102018210595.2 filed on Jun. 28, 2018, the content of which is incorporated by reference herein in its entirety.

TECHNICAL FIELD

The present disclosure relates to sensor devices and methods for producing sensor devices.

BACKGROUND

In automotive applications, wheel speeds can be measured using a combination of a ferromagnetic wheel and a magnetically sensitive sensor. By way of example, such magnetic speed sensors are used in safety-relevant applications, such as e.g. ABS (antilock braking system), motors or transmissions. By their nature, magnetic sensors can be susceptible to magnetic leakage fields. As a result of the advancing electrification and hybridization of modern vehicles, the requirements in respect of an insensitivity of magnetic sensors vis-à-vis magnetic leakage fields have increased and will also increase in the future. Manufacturers of sensor devices endeavor to improve their products and the methods for producing same.

SUMMARY

It may be desirable to develop sensor devices that provide an improved performance in the presence of magnetic leakage fields.

One aspect of the disclosure relates to a sensor device, comprising a magnet having a magnetization in a first direction, and a differential magnetic field sensor arranged on the magnet and having a first sensor element and a second sensor element, wherein the sensor elements are spaced apart in a second direction perpendicular to the first direction, wherein the first sensor element and the second sensor element are designed to detect a magnetic field component in a third direction perpendicular to the first direction and perpendicular to the second direction.

A further aspect of the disclosure relates to a method, comprising providing a magnet having a magnetization in a first direction, and arranging a differential magnetic field sensor having a first sensor element and a second sensor element on the magnet, wherein the sensor elements are spaced apart in a second direction perpendicular to the first direction, wherein the first sensor element and the second sensor element are designed to detect a magnetic field component in a third direction perpendicular to the first direction and perpendicular to the second direction.

BRIEF DESCRIPTION OF THE DRAWINGS

Sensor devices and methods for producing sensor devices in accordance with the disclosure are explained in greater detail below with reference to drawings. The elements shown in the drawings are not necessarily rendered in a manner true to scale relative to one another. Identical reference signs may denote identical components.

FIG. 3A shows a cutout which is rectangular in cross section. FIG. 3B shows a cutout which is triangular in cross section.

FIG. 4A shows the magnetic field distribution of a y-component $B_y$ of a magnetic field. FIG. 4B shows the magnetic field distribution of the x-component $B_x$ of the magnetic field. FIG. 4C shows the magnetic field distribution of the z-component $B_z$ of the magnetic field.

FIG. 5A shows an entire overview of the simulation model. FIG. 5B shows a detailed illustration of a ferromagnetic strip representing a gearwheel in the simulation model.

FIG. 6A shows signal profiles for an xMR sensor under the influence of various leakage fields. FIG. 6B shows signal profiles for a Hall sensor under the influence of various leakage fields.

FIG. 7A shows signal profiles for an xMR sensor under the influence of various leakage fields. FIG. 7B shows signal profiles for a Hall sensor under the influence of various leakage fields.

FIG. 9A illustrates the values for the air gap width at which a Hall sensor that is sensitive in the z-direction operates without errors. FIG. 9B illustrates the values for the air gap width at which an xMR sensor that is sensitive in the y-direction operates without errors.

FIG. 10A shows the influence for an xMR sensor that is sensitive in the x-direction for different strengths of the magnetic leakage field. FIG. 10B shows the influence for an xMR sensor that is sensitive in the y-direction for different strengths of the magnetic leakage field. FIG. 10C shows the influence for a Hall sensor that is sensitive in the z-direction for different strengths of the magnetic leakage field.

FIG. 12A illustrates the values for the air gap width at which a Hall sensor that is sensitive in the z-direction operates without errors. FIG. 12B illustrates the values for the air gap width at which an xMR sensor that is sensitive in the y-direction operates without errors.

FIGS. 13A to 13C illustrate examples of influence of a magnetic leakage field in the tangential direction on the functioning of various magnetic field sensors. FIG. 13A shows the influence for an xMR sensor that is sensitive in the x-direction for different strengths of the magnetic leakage field. FIG. 13B shows the influence for an xMR sensor that is sensitive in the y-direction for different strengths of the magnetic leakage field. FIG. 13C shows the influence for a Hall sensor that is sensitive in the z-direction for different strengths of the magnetic leakage field.

FIG. 15A illustrates the values for the air gap width at which a Hall sensor that is sensitive in the z-direction operates without errors. FIG. 15B illustrates the values for the air gap width at which an xMR sensor that is sensitive in the y-direction operates without errors.

FIGS. 16A to 16C illustrate examples of influence of a magnetic leakage field in the axial direction on the functioning of various magnetic field sensors. FIG. 16A shows the influence for an xMR sensor that is sensitive in the x-direction for different strengths of the magnetic leakage field. FIG. 16B shows the influence for an xMR sensor that is sensitive in the y-direction for different strengths of the magnetic leakage field. FIG. 16C shows the influence for a Hall sensor that is sensitive in the z-direction for different strengths of the magnetic leakage field.

DETAILED DESCRIPTION

Figure 1A:
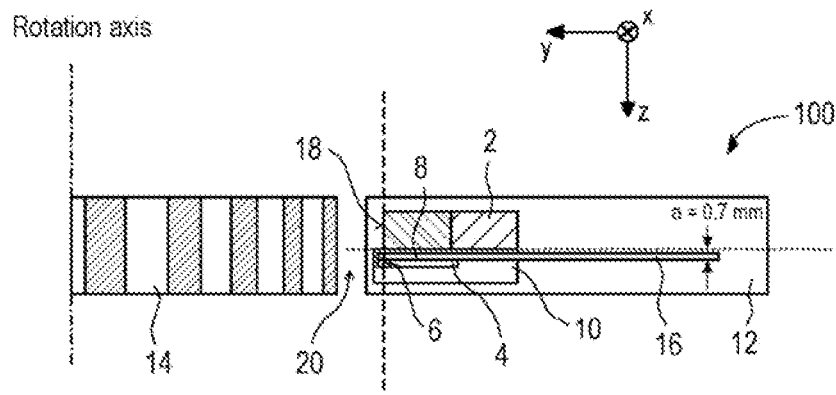
FIGS. 1A and 1B schematically show a cross-sectional side view and a plan view of a sensor device 100 in accordance with the disclosure. The sensor device 100 is arranged relative to a ferromagnetic wheel.
Figure 1B:
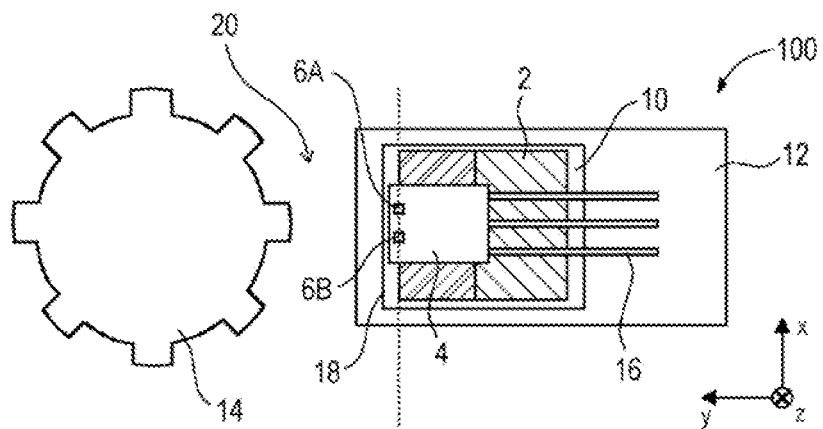

FIGS. 1A and 1B show one example of a sensor device 100 in accordance with the disclosure. FIG. 1A shows a cross-sectional side view of the sensor device 100. FIG. 1B shows a plan view of the sensor device 100. The sensor device 100 is shown in a rectangular coordinate system having three axes (x, y, z). The following observations with regard to the sensor device 100 can also be applied to other sensor devices in accordance with the disclosure.

The sensor device 100 contains a magnet 2 and a differential magnetic field sensor 4 arranged on the magnet 2. The magnetic field sensor 4 comprises a first sensor element 6A and a second sensor element 6B. By way of example, each of the differential sensor elements 6A and 6B per se can be implemented as a resistor bridge having e.g. four resistors. The magnetic field sensor 4 can be arranged on a metal carrier 8. The metal carrier 8 and the magnetic field sensor 4 can at least partly be encapsulated with a first encapsulation material 10 and together with the latter form a sensor package. The sensor device 100 can furthermore at least partly be encapsulated with a second encapsulation material 12. The sensor device 100 can be arranged relative to a ferromagnetic wheel 14.

The magnet 2 is arranged in the x-y-plane and magnetized in the y-direction. In the example, the north pole of the magnet 2 is situated on the left, and the south pole of the magnet 2 is situated on the right. In a further example, the poles of the magnet 2 can be interchanged. The magnet 2 can be a block magnet, in particular. By way of example, the magnet 2 can have a dimension in a range of (6±0.6) mm in the x-direction, a dimension in a range of (7±0.7) mm in the y-direction and a dimension in a range of (3±0.3) mm in the z-direction. The magnet 2 can be designed to provide a magnetic support field for the operation of the sensor device 100.

The magnetic field sensor 4 can be a differential magnetic field sensor. The magnetic field sensor 4 can detect a difference between the magnetic field strength detected at the first sensor element 6A and the magnetic field strength detected at the second sensor element 6B. The magnetic field sensor 4 can be an integrated circuit or a semiconductor chip, such that reference can also be made to a magnetic field sensor IC or a magnetic field sensor chip. The main surfaces of the magnetic field sensor chip 4 lie in the x-y-plane. The sensor elements 6A and 6B are spaced apart in the x-direction, e.g. perpendicular to the magnetization direction of the magnet 2. By way of example, the distance between the sensor elements 6A and 6B in the x-direction can have a value in a range of (1.8±0.2) mm. The first sensor element 6A and the second sensor element 6B are in each case designed to detect a magnetic field component in the z-direction. In other words, the sensor elements 6A and 6B are sensitive with respect to magnetic field components in the z-direction.

In one example, the magnetic field sensor 4 can be a Hall magnetic field sensor that is sensitive in the z-direction. In further examples, the magnetic field sensor 4 can be an xMR sensor that is sensitive in the z-direction, in particular an AMR sensor, a GMR sensor or a TMR sensor. In the case of a Hall sensor, the sensor elements 6A and 6B can be Hall elements or Hall sensor elements, which can be integrated into a circuit of the chip. Signal amplification, analog-to-digital conversion, digital signal processing and/or offset and temperature compensation can furthermore be carried out in such a Hall IC. Besides Hall plates of the Hall sensor, components for the signal amplification and/or the analog-to-digital conversion may or may not be regarded as part of the sensor elements 6A and 6B. In the example in FIG. 1, the Hall sensor can be, in particular, a lateral Hall sensor that detects magnetic fields perpendicular to the main surfaces of the chip.

The magnetic field sensor 4 can be mounted by a main surface on the metal carrier 8. The metal carrier 8 can be produced from copper, nickel, aluminum or high-grade steel, for example. In one example, the metal carrier 8 can be a leadframe having a die pad and one or more connection conductors 16. The magnetic field sensor 4 can be electrically connected to one or more of the connection conductors 16. The connection conductors 16 can at least partly project from the first encapsulation material 10, such that the magnetic field sensor 4 can be electrically contacted from outside the first encapsulation material 10. Furthermore, the connection conductors 16 can at least partly project from the second encapsulation material 12, such that the magnetic field sensor 4 can also be electrically contacted from outside the second encapsulation material 12. The encapsulation materials 10 and 12 can be fabricated for example from a laminate, an epoxy resin, a thermoplastic or a thermosetting polymer.

On account of the relative arrangement of the magnetic field sensor 4 and the magnet 2 shown, the connection conductors 16 can have a completely straight course in the y-direction. That means that the connection conductors 16 do not have to be bent around the magnet 2 in order to project at the location of the first encapsulation material 10. On account of the rectilinear course of the connection conductors 16, the arrangement in FIGS. 1A and 1B can have smaller dimensions in comparison with arrangements having bent connection conductors. Furthermore, the production costs of the arrangement shown can be reduced since the connection conductors 16 do not have to be bent in additional production steps.

The sensor package containing the magnetic field sensor 4 can be secured to the magnet 2 for example using an adhesive (not illustrated). In the example, an axis of the arrangement shown is indicated by a horizontal dashed line. The magnetic field sensor 4, like the magnet 2, can be arranged in the x-y-plane and be at a distance a in an example range of (0.7±0.1) mm from the axis of symmetry or the adjacent main surface of the magnet 2. Generally, the distance a can be in a range of 0.2 mm to 1.2 mm.

In each of FIGS. 1A and 1B, a vertically dashed line indicates that the sensor elements 6A and 6B are aligned with a side edge 18 of the magnet 2 extending in the x-direction. More precisely, the sensor elements 6A and 6B and the side edge 18 of the magnet 2 are arranged congruently with respect to one another in a projection along the z-direction (cf. FIG. 1B). Even more precisely, the centers of the sensor elements 6A and 6B and the side edge 18 of the magnet 2 are arranged congruently with respect to one another in a projection along the z-direction (cf. FIG. 1B). Here the first sensor element 6A and the second sensor element 6B can be at an identical distance from the midpoint of the side edge 18 of the magnet 2. If the sensor elements 6A and 6B are Hall sensor elements, in particular the (lateral) Hall plates of the sensor elements 6A and 6B can be aligned or congruent with the side edge 18 of the magnet 2.

On account of the congruent arrangement, the sensor elements 6A and 6B can be arranged at identical magnetic operating points of the magnet 2. The sensor elements 6A and 6B can be exposed to the same magnetic offset, such that the differential signal detected by the magnetic field sensor 4 has no magnetic offset. Further signal processing of the differential signal or the signal path design implemented for this can be simplified as a result. By way of example, the design of an analog-to-digital conversion need not take account of an offset. FIG. 4C, which will be discussed later, additionally reveals that the sensor elements 6A and 6B are arranged in a magnetic field distribution of the $B_z$ magnetic field component of the magnet 2 along the y-direction at a local extremum.

The sensor device 100 and the ferromagnetic wheel 14 can be separated from one another by an air gap 20. A width of the air gap here can be for example less than 2.7 mm, less than 2.5 mm, less than 2.0 mm, less than 1.5 mm, less than 1.0 mm or less than 0.7 mm. In further examples, the width of the air gap can also be larger. The measured signal amplitude can be dependent on the gearwheel geometry and the strength of the magnet. The ferromagnetic wheel 14 is designed to rotate about a rotation axis extending in the z-direction. In FIG. 1A, such a rotation axis is indicated by a vertical dot-dashed line, wherein only the right-hand half of the ferromagnetic wheel 14 is illustrated for illustrational reasons.

The ferromagnetic wheel 14 can be, in particular, a ferromagnetic gearwheel. The magnet 2 generates a support field for the magnetic field sensor 4. On account of the nonuniform shape of the ferromagnetic wheel 14, during a rotation of the ferromagnetic wheel 14, the magnetic field detected by the magnetic field sensor 4 changes and the magnetic field sensor 4 generates output pulses. A control unit (not illustrated) can count the output pulses and calculate the speed of the rotating ferromagnetic wheel 14. In one example, the sensor device 100 can comprise a third sensor element (not illustrated), which can be arranged for example between the first sensor element 6A and the second sensor element 6B. The third sensor element can be designed to detect a direction of rotation of the ferromagnetic wheel 14. The sensor device 100 can be used for example in automotive applications for determining wheel speeds, in particular in safety-relevant applications, such as e.g. ABS (antilock braking system), motors or transmissions.

The differential scanning principle of the magnetic field sensor 4 can serve to cancel out magnetic leakage fields during the desired detection of magnetic fields. There may be increased occurrences of magnetic leakage fields in automotive applications on account of the increasing electrification and hybridization of modern automobiles. The ferromagnetic wheel 14, on account of its irregular shape, can act as a magnetic flux concentrator and also modulate undesired magnetic leakage fields besides the magnetic support field generated by the magnet 2. Such a modulation of leakage fields is present in particular in the case of an air gap 20 having a small width. A homogeneous leakage field can be distorted by the irregular shape of the ferromagnetic wheel 14. Therefore, the leakage field may no longer be homogeneous in the case of small air gap widths. As a result, the first sensor element 6A and the second sensor element 6B can be exposed to different offset fields. However, the differential sensor principle is based on homogeneous, identical fields at the positions of the sensor elements 6A and 6B. The magnetic field sensor 4 can thus no longer mutually cancel out the leakage fields. In the worst case, the leakage field can introduce incorrect pulses and/or lead to additional pulses and/or lead to missing pulses.

The sensor device 100 can be designed to prevent the described influence of inhomogeneous magnetic leakage fields in the case of a small air gap width. FIGS. 8 to 16C illustrate the influences of magnetic leakage fields on the functioning of different sensors. FIGS. 8 to 16C reveal, inter alia, that such sensor devices are suitable for measurements in the case of small air gap widths in which the direction of the sensitivity of the sensor elements corresponds to the direction of the rotation axis of the ferromagnetic wheel.

Figure 2A:
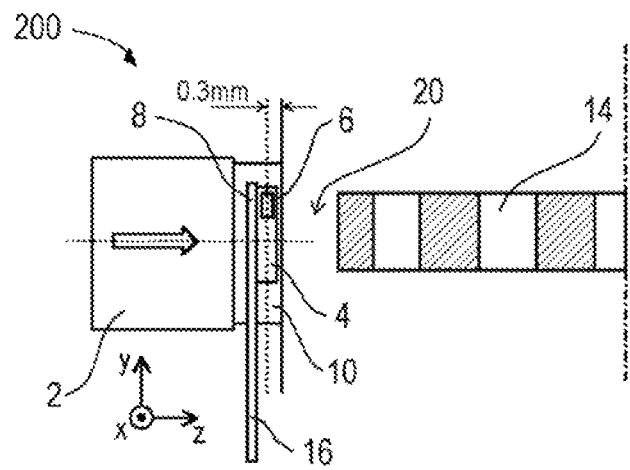
FIGS. 2A and 2B schematically show a cross-sectional side view and a front view of a sensor device 200 in accordance with the disclosure. The sensor device 200 is arranged relative to a ferromagnetic wheel.
Figure 2B:
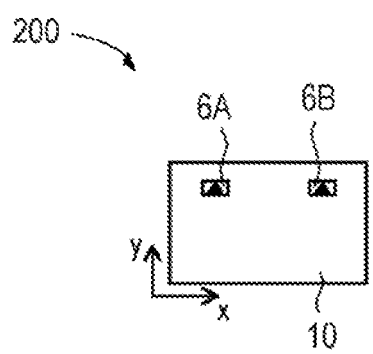

FIGS. 2A and 2B show one example of a sensor device 200 in accordance with the disclosure. FIG. 2A shows a cross-sectional side view of the sensor device 200. FIG. 2B shows a front view of the sensor device 200. The sensor device 200 is shown in a rectangular coordinate system having three axes (x, y, z). The sensor device 200 can be at least partly similar to the sensor device 100 from FIGS. 1A and 1B, such that explanations concerning FIGS. 1A and 1B may also be applicable to FIGS. 2A and 2B.

The sensor device 200 contains a magnet 2 and a differential magnetic field sensor 4 arranged on the magnet 2. The magnetic field sensor 4 comprises a first sensor element 6A and a second sensor element 6B. The magnetic field sensor 4 can be arranged on a metal carrier 8. The metal carrier 8 can comprise a die pad and one or more connection conductors 16. The metal carrier 8 and the magnetic field sensor 4 can at least partly be encapsulated with a first encapsulation material 10 and together with the latter form a sensor package. The sensor device 200 can be arranged relative to a ferromagnetic wheel 14. The sensor device 200 and the ferromagnetic wheel 14 can be separated from one another by an air gap 20.

The magnetic field sensor 4 can be an integrated circuit or a semiconductor chip. The main surfaces of the magnetic field sensor 4 are arranged in the x-y-plane. The sensor elements 6A and 6B are spaced apart in the x-direction. The first sensor element 6A and the second sensor element 6B are designed to detect a magnetic field component in the y-direction. In other words, the sensor elements 6A and 6B are sensitive with respect to magnetic field components in the y-direction. In FIG. 2B, the sensitivity of the sensor elements 6A and 6B in the y-direction is indicated by small triangles at the positions of the sensor elements 6A and 6B. By way of example, the magnetic field sensor 4 can be an xMR sensor that is sensitive in the y-direction, in particular an AMR sensor, a GMR sensor or a TMR sensor. Alternatively, the magnetic field sensor 4 can be a corresponding vertical Hall sensor. A distance between the sensor elements 6A, 6B and the right-hand main surface of the sensor package or of the encapsulation material 10 can have a value in an example range of (0.3±0.05) mm. Generally, the distance can be in a range of 0.05 mm to 0.55 mm.

The magnet 2 is arranged in the x-x-plane and magnetized in the z-direction. In the example, the magnetization direction is indicated by an arrow. The north pole of the magnet 2 can thus be situated on the left, and the south pole of the magnet 2 on the right. In a further example, the poles of the magnet 2 can be interchanged. In FIG. 2A, an axis of symmetry of the magnet 2 is indicated by a horizontal dashed line. In order that the support field of the magnet 2 is effective for the operation of the sensor device 200, the sensor elements 6A and 6B should not be arranged on the axis of symmetry of the magnet 2, but rather offset slightly with respect thereto. In a further example, the sensor elements 6A and 6B can be arranged on the axis of symmetry of the magnet 2. In this case, the magnetization direction of the magnet 2 should not extend exactly in the z-direction, but rather be inclined somewhat with respect thereto. The sensor elements 6A and 6B are then offset slightly with respect to the magnetization direction of the magnet 2 and the support field of the magnet 2 can be effective for the operation of the sensor device 200. In yet another example, the sensor elements 6A and 6B may not be arranged on the axis of symmetry of the magnet 2 and, in addition, the magnetization direction of the magnet 2 may not extend exactly in the z-direction, but rather be inclined with respect thereto.

In the example, the connection conductors 16 have a completely straight course in the y-direction. In a further example, the connection conductors 16 can be bent around the magnet 2 in order thereby to extend on the left alongside the magnet 2 in the z-direction.

The ferromagnetic wheel 14 is designed to rotate about a rotation axis extending in the y-direction. In FIG. 2A, such a rotation axis is indicated by a vertical dot-dashed line. FIG. 2A illustrates only the left-hand half of the ferromagnetic wheel 14 for illustrational reasons.

The sensor device 200 can have a relative arrangement of the magnetization direction of the magnet 2, of the direction of the sensitivity of the sensor elements 6A, 6B, and of the direction of the rotation axis of the ferromagnetic wheel 14, which is similar to the arrangement described in FIGS. 1A and 1B. In a manner similar to the sensor device 100 from FIGS. 1A and 1B, the sensor device 200 in FIGS. 2A and 2B can therefore likewise be designed to prevent an influence of inhomogeneous leakage fields in the case of a small air gap width.

Figure 3A:
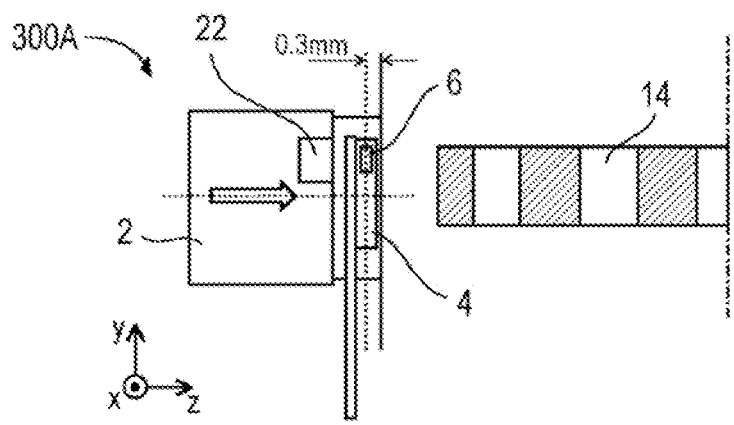
FIGS. 3A and 3B show lateral cross-sectional views of sensor devices 300A and 300B in accordance with the disclosure each of which comprises a magnet having a cutout.
Figure 3B:
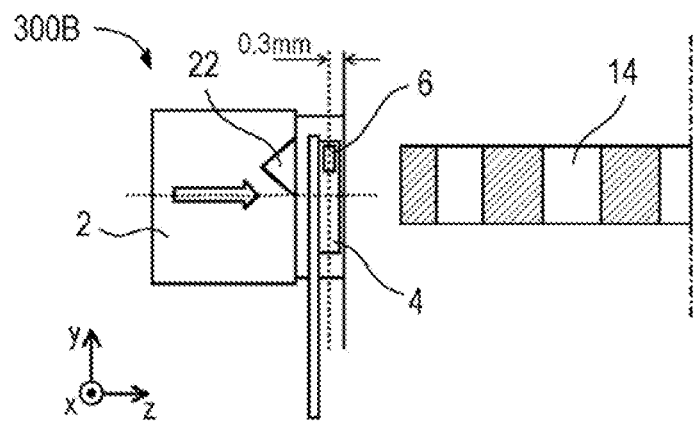

FIGS. 3A and 3B show examples of sensor devices 300A and 300B in accordance with the disclosure. FIG. 3A shows a cross-sectional view of the sensor device 300A. FIG. 3B shows a cross-sectional view of the sensor device 300B.

The sensor devices 300A and 300B can be similar to the sensor device 200 from FIGS. 2A and 2B. In contrast thereto, the sensor devices 300A and 300B contain a magnet 2 having one or more cutouts 22. In order to avoid saturation effects of the sensors (linear region), it may be beneficial to keep the magnetic operating point low. This can be achieved using the cutout(s) 22 in the magnet 2. The cutout(s) 22 can be arranged in particular below the sensor elements 6A and 6B. To put it more precisely, the cutout(s) 22 can be arranged beneath the sensor elements 6A and 6B in an orthogonal projection or plan view of the surface (situated on the right in FIGS. 3A and 3B) of the magnet 2. In one example, the magnet 2 can have two cutouts 22, wherein a respective one of the two cutouts 22 is arranged below each of the sensor elements 6A and 6B. In a further example, the magnet 2 can have exactly one cutout 22, wherein the cutout 22 is arranged both below the first sensor element 6A and below the second sensor element 6B. In general, the shape of the cutouts 22 can depend on the geometry of the sensor. In the example in FIG. 3A, a cross section of the cutout 22 has a rectangular shape. In the example in FIG. 3B, a cross section of the cutout 22 has a triangular shape.

Figure 4A:
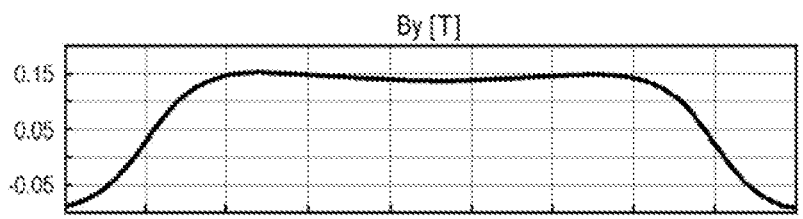
FIGS. 4A to 4C show magnetic field distributions of a magnet of a sensor device in accordance with the disclosure along a y-axis.
Figure 4B:
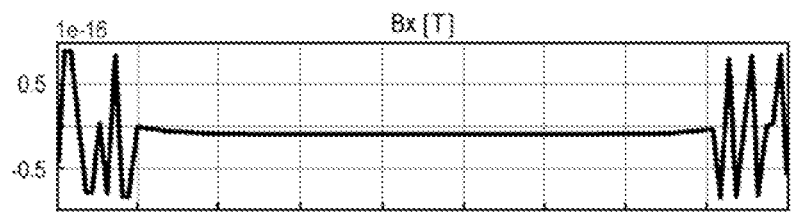
Figure 4C:
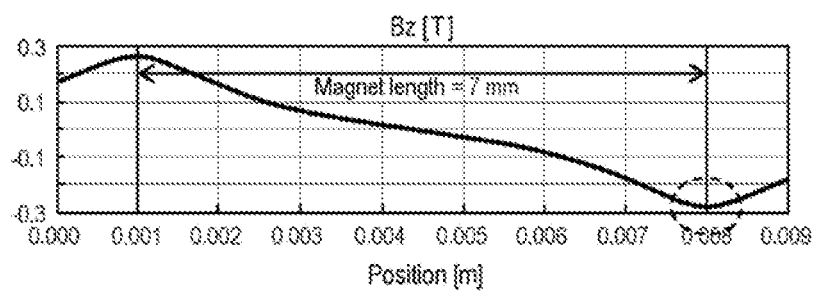

FIGS. 4A and 4C shows examples of magnetic field distributions of a magnet along a y-axis of the magnet. The magnet can be part of a sensor device in accordance with the disclosure. By way of example, the magnet 2 in FIGS. 1A and 1B can be involved. In the example in FIGS. 4A to 4C, the magnet has a length of 7 mm. The left-hand edge of the magnet is situated at the y-position 0.001 m and the right-hand edge is situated at the y-position 0.008 m. A magnetic field sensor of the sensor device or its sensor elements are arranged at a distance of 0.7 mm from the magnet (cf. e.g. FIG. 1A). The magnet has a remanence Br of 1.2 T. The two sensor elements of the magnetic field sensor are exposed to an identical $B_z$ offset.

FIG. 4A shows the magnetic field distribution of the y-component $B_y$ of the magnetic field. In FIG. 4A, the strength of the magnetic field component $B_y$ is plotted against the y-position of the magnet.

FIG. 4B shows the magnetic distribution of the x-component $B_x$ of the magnetic field. In FIG. 4B, the strength of the magnetic field component $B_x$ is plotted against the y-position of the magnet.

FIG. 4C shows the magnetic field distribution of the z-component $B_z$ of the magnetic field. In FIG. 4C, the strength of the magnetic field component $B_z$ is plotted against the y-position of the magnet. At the y-position of the left-hand edge of the magnet (y=0.001), the z-component of the magnetic field has a local maximum. At the y-position of the right-hand edge of the magnet (y=0.008), the z-component of the magnetic field has a local minimum. In the example, the sensor elements of the magnetic field sensor can be situated at the y-position 0.008 of the local minimum.

During the production of a sensor device in accordance with the disclosure, the magnetic field sensor can be arranged on the magnet in practice using a pick-and-place method. In this case, a deviation between the desired positioning and the actual positioning of the magnetic field sensor relative to the magnet can occur on account of inaccuracies of the method. If the sensor elements are exposed to a different magnetic operating point as a result of such a deviation, this can lead to a corruption of measurement results of the sensor. The arrangement of the sensor elements of the magnetic field sensor at a local extremum makes it possible to avoid such corruptions. At the position of a local extremum, a slight shift of the sensor elements (for example) in the y-direction leads to a small change in the magnetic field since the gradient of the magnetic field profile at the position of the extremum is equal to zero. In the example in FIG. 4C, the sensor elements can accordingly preferably be positioned at the location of the local maximum at the y-position 0.001 or at the location of the local minimum at the y-position 0.008.

Figure 5A:
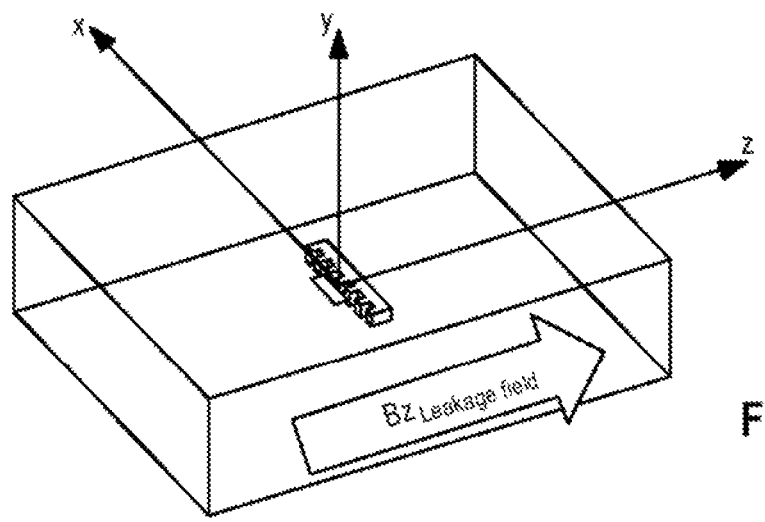
FIGS. 5A and 5B illustrate an example simulation model illustrating the influence of a leakage field on various magnetic field sensors in the case of a small air gap width.
Figure 5B:
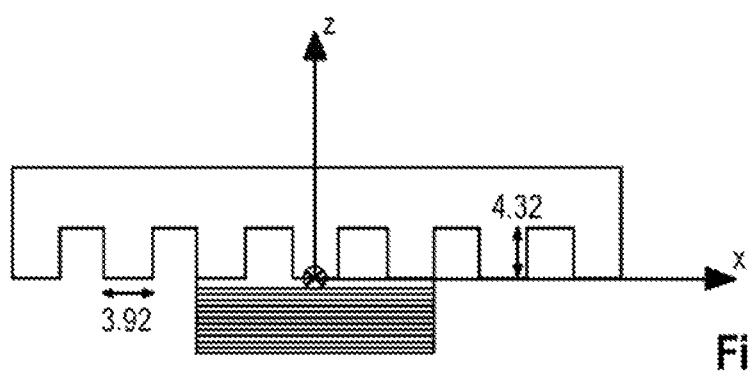

FIGS. 5A and 5B illustrate examples of a simulation model illustrating the influence of a leakage field on the measurement results of various magnetic field sensors in the case of a small air gap width. In the simulation, a homogeneous leakage field is disturbed by the irregular shape of a ferromagnetic gearwheel. Examples of results of the simulation model are shown in FIGS. 6A, 6B, 7A, and 7B.

FIG. 5A shows the simulated scenario in a rectangular three-dimensional coordinate system having x-, y- and z-axes. A scenario without a support field provided by a magnet is considered in the example in FIG. 5A. A ferromagnetic strip representing a gearwheel moves along the x-axis. Furthermore, a homogeneous magnetic leakage field $B_{Zleakage}$ field extends along the z-axis. The example in FIG. 5A assumes an ideal leakage field source which can generate DC fields of 0 mT, 1 mT, 2 mT, 3 mT, 4 mT and 5 mT at the position of the sensor elements of a magnetic field sensor.

FIG. 5B shows a detailed illustration of the ferromagnetic strip. The ferromagnetic strip has a comb-shaped course, wherein a width of a simulated gearwheel has an example value of 3.92 and a height of the gearwheel has an example value of 4.32. In the example in FIG. 5B, the ferromagnetic strip has a relative permeability $\mu_r$ of 4000.

Figure 6A:
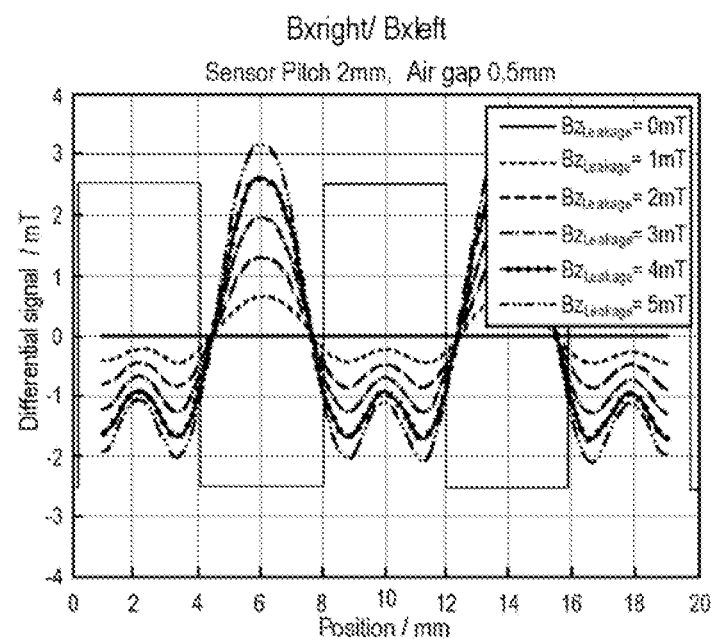
FIGS. 6A and 6B show example profiles of differential signal amplitudes as a function of position.
Figure 6B:
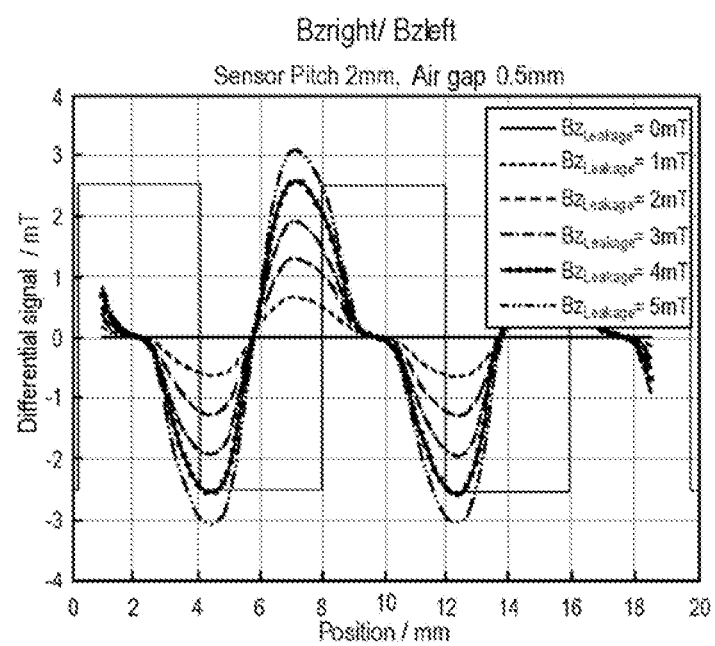

FIGS. 6A and 6B show example profiles of differential signal amplitudes as a function of the position of the ferromagnetic strip. In the example in FIGS. 6A and 6B, the distance between the sensor elements (sensor pitch) has a value of 2 mm, and the air gap width has a value of 0.5 mm. The differential signal detected by the respective magnetic field sensor is plotted in mT against the position of the ferromagnetic strip in mm. The signal profiles in the case of magnetic leakage fields in the z-direction having the values 0 mT, 1 mT, 2 mT, 3 mT, 4 mT and 5 mT are shown.

FIG. 6A shows the signal profiles for the magnetic leakage fields of the various strengths, said signal profiles having been detected by a differential xMR sensor. The signals correspond in each case to a difference between the magnetic field detected at the right-hand sensor element (cf. "Bxright") and the magnetic field detected at the left-hand sensor element (cf. "Bxleft") in the x-direction. Alternatively, the sensor can be a vertical Hall sensor.

FIG. 6B shows the signal profiles for the magnetic leakage fields of the various strengths, said signal profiles having been detected by a differential Hall sensor. The signals correspond in each case to a difference between the magnetic field detected at the right-hand sensor element (cf. "Bxright") and the magnetic field detected at the left-hand sensor element (cf. "Bxleft") in the z-direction. Alternatively, the sensor can be an xMR sensor that is sensitive in the z-direction.

FIGS. 6A and 6B illustrate that the function of both sensors is influenced by the magnetic leakage field. This becomes clear in particular from the signal profile in the case of the magnetic leakage field of 5 mT. A differential sensor should ideally suppress an effect of the magnetic leakage field on the measurement result. In the case of a small air gap width, however, the leakage field is deflected and amplified by the ferromagnetic gearwheel. Instead of obtaining a signal value of zero, the signal detected by the sensor exhibits an excursion up to a value of the differential signal of approximately 3 mT.

Figure 7A:
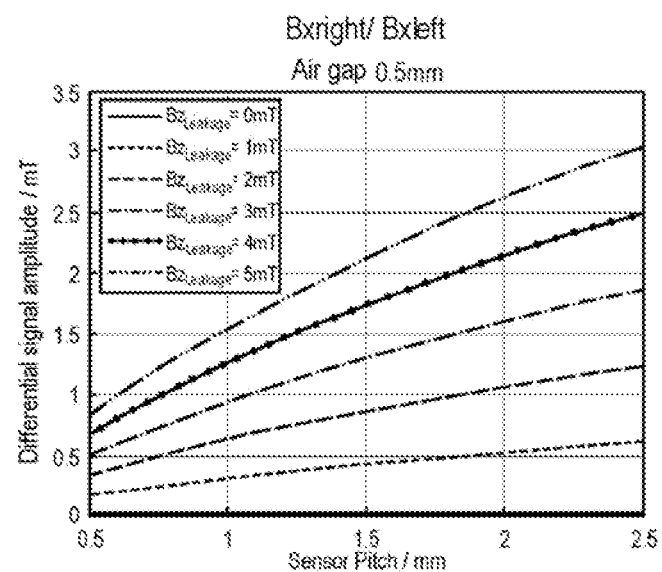
FIGS. 7A and 7B show example profiles of differential signal amplitudes as a function of distance between sensor elements of a sensor device.
Figure 7B:
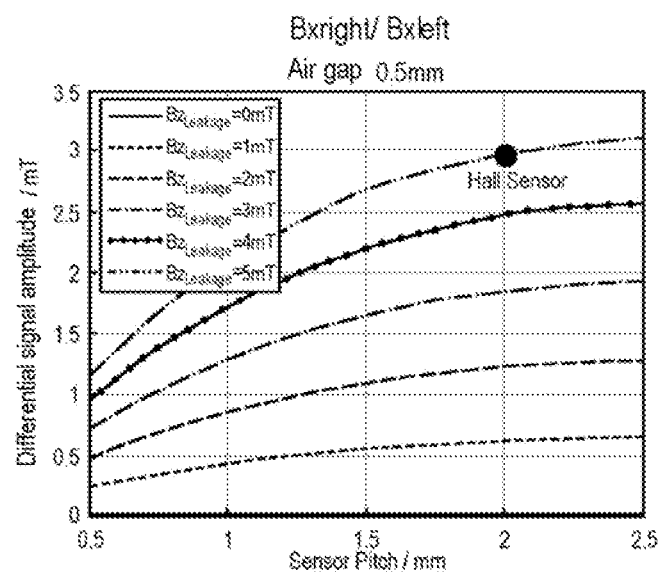

FIGS. 7A and 7B show example profiles of differential signal amplitudes as a function of the distance between the sensor elements of a sensor device (sensor pitch). FIG. 7A shows signal profiles for an xMR sensor under the influence of various magnetic leakage fields. Alternatively, the sensor can be a corresponding vertical Hall sensor. FIG. 7B shows signal profiles for a Hall sensor under the influence of various magnetic leakage fields. Alternatively, the sensor can be a corresponding xMR sensor. In the example in FIGS. 7A and 7B, the air gap width has a value of 0.5 mm. The differential signal detected by the respective magnetic field sensor is plotted in mT against the distance between the sensor elements in mm. The signal profiles in the case of magnetic leakage fields in the z-direction having the values 0 mT, 1 mT, 2 mT, 3 mT, 4 mT and 5 mT are shown.

FIGS. 7A and 7B illustrate that the influence of the magnetic leakage field on the function of the magnetic field sensors increases with an increase in the distance between the sensor elements.

Figure 8:
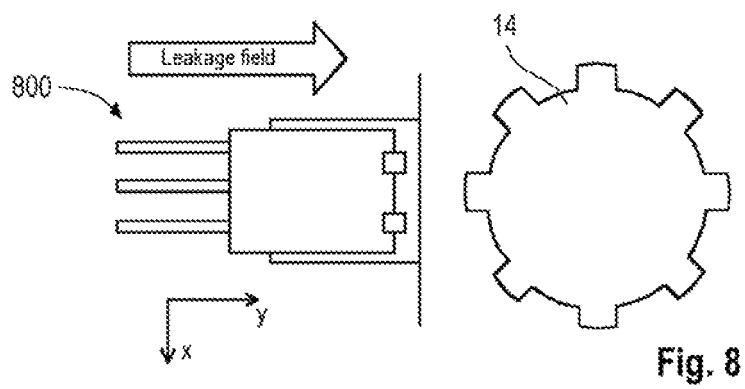
FIG. 8 schematically shows a plan view of a sensor device 800 in accordance with the disclosure. The sensor device 800 is under the influence of a magnetic leakage field in the direction of the air gap between the sensor device 800 and a ferromagnetic wheel.

FIG. 8 schematically shows a plan view of a sensor device 800 in accordance with the disclosure. The sensor device 800 can be similar to the sensor device 100 from FIGS. 1A and 1B, for example. A magnetic leakage field in the direction of the air gap between the sensor device 800 and a ferromagnetic wheel 14 (y-direction) is represented by an arrow. The influences of the magnetic leakage field on the function of the sensor device 800 in the case of various magnetic field sensors are shown in FIGS. 9A, 9B, 10A, 10B, and 10C.

Figure 9A:
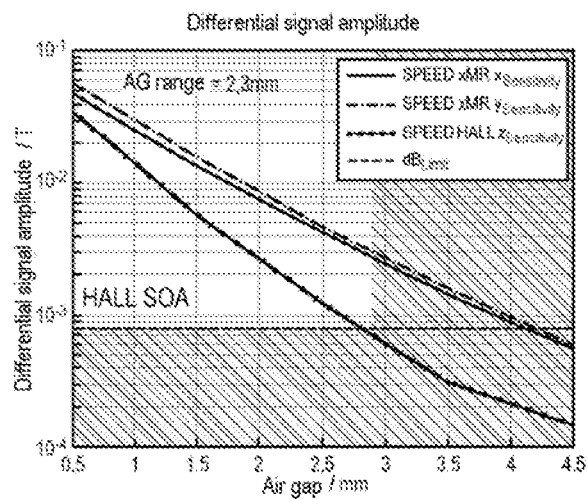
FIGS. 9A and 9B show example profiles of differential signal amplitudes as a function of the air gap width under the influence of a magnetic leakage field in the direction of the air gap for various magnetic field sensors.
Figure 9B:
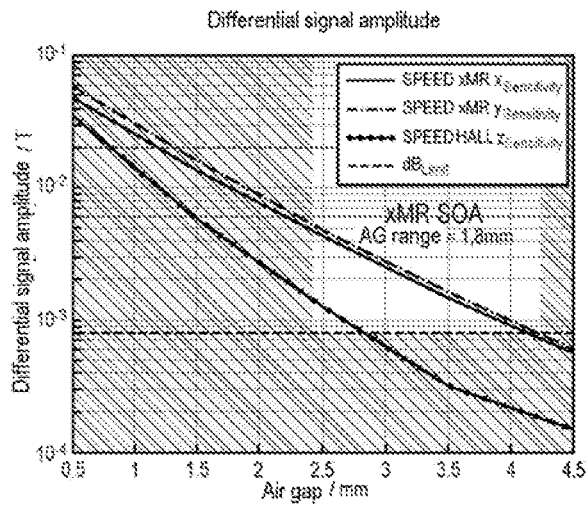

FIGS. 9A and 9B show example profiles of differential signal amplitudes as a function of an air gap width under the influence of a magnetic leakage field in the direction of the air gap (cf. FIG. 8). Signal profiles for an xMR sensor that is sensitive in the x-direction, for an xMR sensor that is sensitive in the y-direction, and for a Hall sensor that is sensitive in the z-direction, are shown. The differential signal detected by the respective magnetic field sensor is plotted in T against the air gap width in mm. A horizontal dashed line represents a dB limit. The respective sensor operates if its differential signal amplitude progresses above the dB limit. If the signal amplitude falls below the dB limit value, no further switching pulses are output by the sensor. It is evident from FIGS. 9A and 9B that the differential signal amplitudes of the xMR sensors are greater than the differential signal amplitude of the Hall sensor.

FIG. 9A illustrates the values for the air gap width at which the Hall sensor that is sensitive in the z-direction operates without errors (cf. non-hatched region). Accordingly, the Hall sensor operates without errors for air gap widths of 0.5 mm to approximately 2.8 mm, that is to say in a range of approximately 2.3 mm (cf. AG range). In this range, the differential signal amplitude of the Hall sensor progresses above the dB limit. Furthermore, the leakage field has a negligible influence, as revealed by FIG. 10C discussed below.

FIG. 9B illustrates the values for the air gap width at which the xMR sensor that is sensitive in the y-direction operates without errors (cf. non-hatched region). Accordingly, the xMR sensor operates without errors for air gap widths of approximately 2.4 mm to approximately 4.2 mm, that is to say in a range of approximately 1.8 mm (cf. AG range). In this range, the differential signal amplitudes of the xMR sensor progress above the dB limit. Furthermore, the leakage field has a negligible influence, as revealed by FIG. 10B discussed below.

Figures 10A, 10B, 10C:
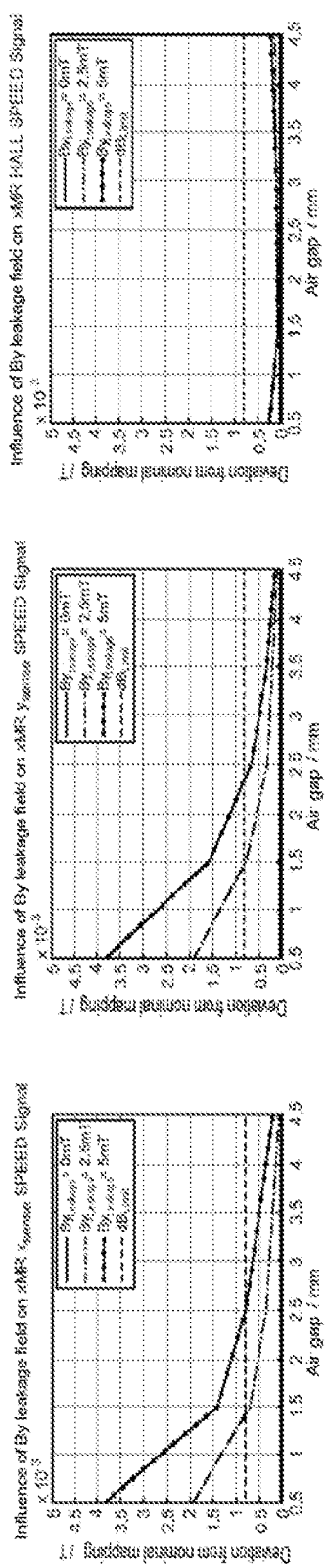
FIGS. 10A to 10C illustrate examples of influence of a magnetic leakage field in the direction of the air gap on the functioning of various magnetic field sensors.

FIGS. 10A to 10C illustrate examples of influence of a magnetic leakage field in the direction of the air gap (cf. FIG. 8) on the functioning of various magnetic field sensors. In FIGS. 10A to 10C, the deviation from the nominal mapping in mT is in each case plotted against the air gap width in mm. Profiles for leakage fields in the direction of the air gap with a magnitude of 0 mT, 2.5 mT and 5 mT are illustrated. A horizontal dashed line at an example value of approximately 0.8 mT represents a dB limit. The influence of the leakage field on the functioning of the respective sensor is negligible if the signal profile respectively shown progresses below the dB limit.

FIG. 10A illustrates the influence of a leakage field in the direction of the air gap on the functioning of an xMR sensor that is sensitive in the x-direction. It becomes clear from the curve for a leakage field of 5 mT that the leakage field exceeds the dB limit in the case of an air gap width of less than approximately 2.5 mm, with the result that the sensor cannot operate without errors. That means that in the presence of a leakage field of 5 mT the sensor is not suitable for operation with an air gap width of less than 2.5 mm.

FIG. 10B illustrates the influence of a leakage field in the direction of the air gap on the functioning of an xMR sensor that is sensitive in the y-direction. It becomes clear from the curve for a leakage field of 5 mT that the leakage field exceeds the dB limit in the case of an air gap width of less than approximately 2.4 mm, with the result that the sensor cannot operate without errors. Accordingly, in the presence of a leakage field of 5 mT the sensor is not suitable for operation with an air gap width of less than 2.4 mm (in this respect, also cf. FIG. 9B).

FIG. 10C illustrates the influence of a leakage field in the direction of the air gap on the functioning of a Hall sensor that is sensitive in the z-direction. It becomes clear from the curves in FIG. 10C that the leakage field signals progress below the dB limit over the entire range of the air gap width. In this regard, the Hall sensor is accordingly suitable for operation with an arbitrary air gap width in the range illustrated (in this respect, also cf. FIG. 9A). FIG. 9A has already revealed that with regard to the differential signal amplitude the Hall sensor operates without errors for air gap widths of less than approximately 2.8 mm.

Figure 11:
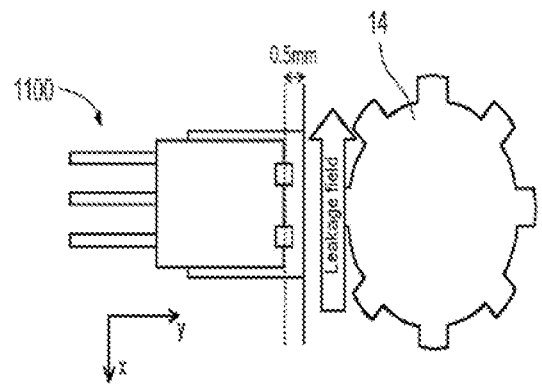
FIG. 11 schematically shows a plan view of a sensor device 1100 in accordance with the disclosure. The sensor device 1100 is under the influence of a magnetic leakage field in a direction tangential to a ferromagnetic wheel.

FIG. 11 schematically shows a plan view of a sensor device 1100 in accordance with the disclosure. The sensor device 1100 can be similar to the sensor device 100 from FIGS. 1A and 1B, for example. A magnetic leakage field in a direction tangential to a ferromagnetic wheel 14 (x-direction) is represented by an arrow. The influences of the magnetic leakage field on the function of the sensor device 1100 in the case of various magnetic field sensors are shown in FIGS. 12A, 12B, 13A, 13B, and 13C.

Figure 12A:
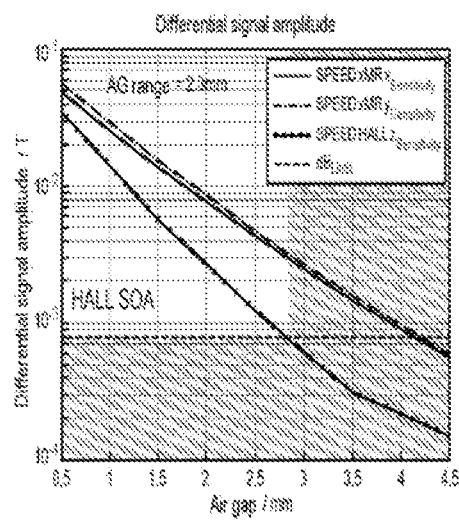
FIGS. 12A and 12B show example profiles of differential signal amplitudes as a function of the air gap width under the influence of a magnetic leakage field in the tangential direction for various magnetic field sensors.
Figure 12B:
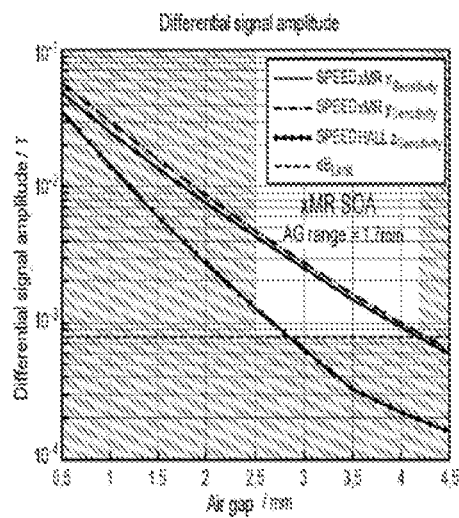

FIGS. 12A and 12B show example profiles of differential signal amplitudes as a function of the air gap width under the influence of the magnetic leakage field in a tangential direction (cf. FIG. 11) for various sensors.

FIG. 12A illustrates the values for the air gap width at which the Hall sensor that is sensitive in the z-direction operates without errors (cf. non-hatched region). Accordingly, the Hall sensor operates without errors for air gap widths of 0.5 mm to approximately 2.8 mm.

FIG. 12B illustrates the values for the air gap width at which the xMR sensor that is sensitive in the y-direction operates without errors. Accordingly, the xMR sensor operates without errors for air gap widths of approximately 2.5 mm to approximately 4.2 mm.

FIGS. 13A to 13C illustrate examples of influence of a leakage field in a tangential direction (cf. FIG. 11) on the functioning of various magnetic field sensors. The observations made in conjunction with FIGS. 10A to 10C are also applicable to FIGS. 13A to 13C.

FIG. 13A illustrates the influence of a leakage field in a tangential direction on the functioning of an xMR sensor that is sensitive in the x-direction. It becomes clear from FIG. 13A that the leakage field signals progress below the dB limit over the entire range of the air gap width.

FIG. 13B illustrates the influence of a leakage field in a tangential direction on the functioning of an xMR sensor that is sensitive in the y-direction. It becomes clear from the curve for a leakage field of 5 mT that the leakage field exceeds the dB limit in the case of an air gap width of less than approximately 2.5 mm, with the result that the sensor cannot operate without errors.

FIG. 13C illustrates the influence of a leakage field in a tangential direction on the functioning of a Hall sensor that is sensitive in the z-direction. It becomes clear from FIG. 13C that the leakage field signals progress below the dB limit over the entire range of the air gap width.

Figure 14:
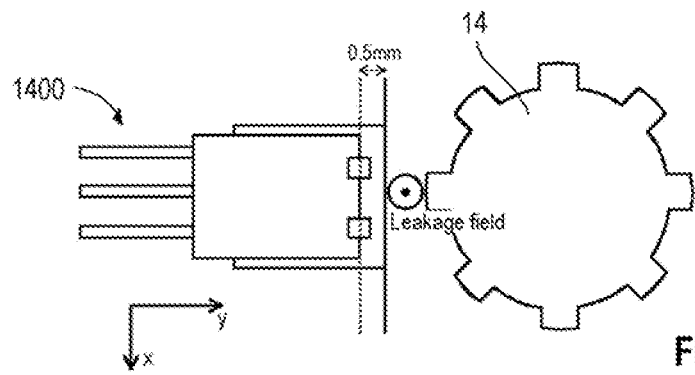
FIG. 14 schematically shows a plan view of a sensor device 1400 in accordance with the disclosure. The sensor device 1400 is under the influence of a magnetic leakage field in the direction of a rotation axis of a ferromagnetic wheel.

FIG. 14 schematically shows a plan view of a sensor device 1400 in accordance with the disclosure. The sensor device 1400 can be similar to the sensor device 100 from FIGS. 1A and 1B, for example. A magnetic leakage field in the direction of a rotation axis of a ferromagnetic wheel 14 (z-direction) is represented by a circle with a dot. The influences of the magnetic leakage field on the function of the sensor device 1400 in the case of various magnetic field sensors are shown in FIGS. 15A, 15B, 16A, 16B, and 16C.

Figure 15A:
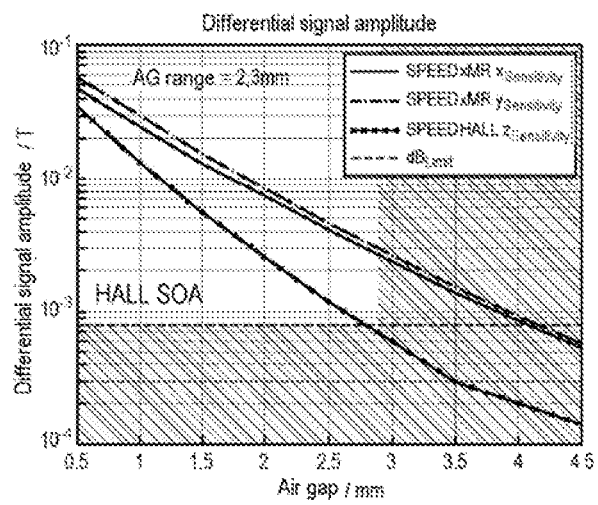
FIGS. 15A and 15B show examples of profiles of differential signal amplitudes as a function of the air gap width under the influence of a magnetic leakage field in the axial direction for various magnetic field sensors.
Figure 15B:
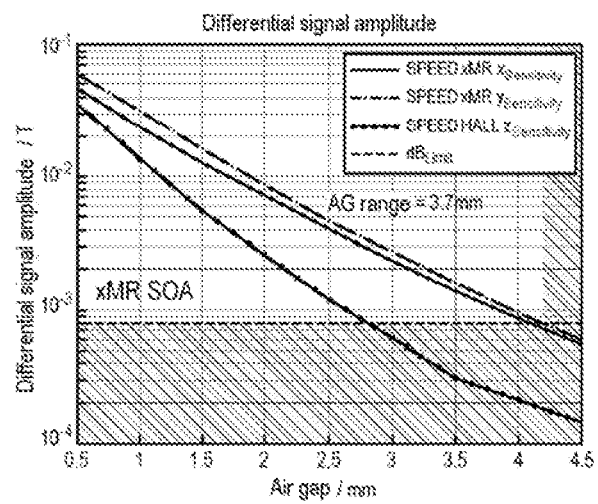

FIGS. 15A and 15B shows example profiles of differential signal amplitudes as a function of the air gap width under the influence of a magnetic leakage field in an axial direction (cf. FIG. 14). The observations made in conjunction with FIGS. 9A and 9B are also applicable to FIGS. 15A and 15B.

FIG. 15A illustrates the values for the air gap width at which the Hall sensor that is sensitive in the z-direction operates without errors. Accordingly, the Hall sensor operates without errors for air gap widths of 0.5 mm to approximately 2.8 mm.

FIG. 15B illustrates the values for the air gap width at which the xMR sensor that is sensitive in the y-direction operates without errors. Accordingly, the xMR sensor operates without errors for air gap widths of 0.5 mm to approximately 4.2 mm.

FIGS. 16A to 16C illustrate examples of influence of a leakage field in an axial direction (cf. FIG. 14) on the functioning of various magnetic field sensors. The observations made in conjunction with FIGS. 10A to 10C are also applicable to FIGS. 16A to 16C.

FIG. 16A illustrates the influence of a leakage field in an axial direction on the functioning of an xMR sensor that is sensitive in the x-direction. It becomes clear from FIG. 16A that the leakage field signals progress below the dB limit over the entire range of the air gap width.

FIG. 16B illustrates the influence of a leakage field in an axial direction on the functioning of an xMR sensor that is sensitive in the y-direction. It becomes clear from FIG. 16B that the leakage field signals progress below the dB limit over the entire range of the air gap width.

FIG. 16C illustrates the influence of a leakage field in an axial direction on the functioning of a Hall sensor that is sensitive in the z-direction. It becomes clear from FIG. 16C that the leakage field signals progress below the dB limit over the entire range of the air gap width.

Figure 17:
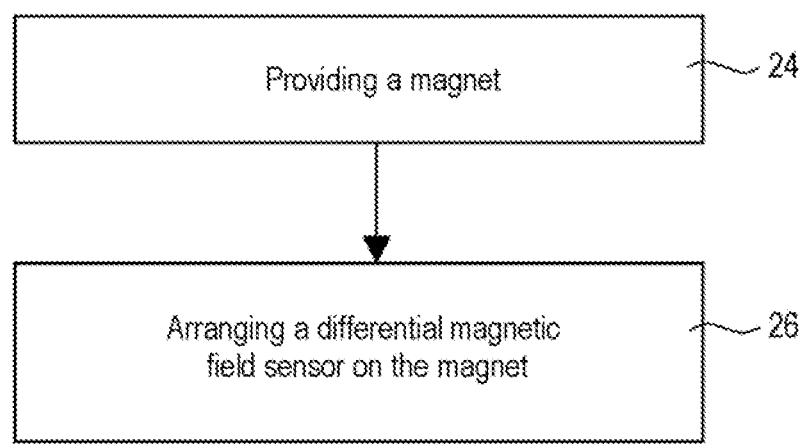
FIG. 17 shows a flow diagram of a method for producing a sensor device in accordance with the disclosure.

FIG. 17 shows a flow diagram of a method for producing a sensor device in accordance with the disclosure. Block 24 involves providing a magnet having a magnetization in a first direction. Block 26 involves arranging a differential magnetic field sensor having a first sensor element and a second sensor element on the magnet. The sensor elements are spaced apart in a second direction perpendicular to the first direction. The first sensor element and the second sensor element are designed to detect a magnetic field component in a third direction perpendicular to the first direction and perpendicular to the second direction.

EXAMPLES

Example 1 is a sensor device, comprising a magnet having a magnetization in a first direction; and a differential magnetic field sensor arranged on the magnet and having a first sensor element and a second sensor element, wherein the sensor elements are spaced apart in a second direction perpendicular to the first direction, wherein the first sensor element and the second sensor element are designed to detect a magnetic field component in a third direction perpendicular to the first direction and perpendicular to the second direction.

Example 2 is a sensor device according to example 1, wherein the sensor device is arranged relative to a ferromagnetic wheel, wherein the ferromagnetic wheel is designed to rotate about a rotation axis extending in the third direction.

Example 3 is a sensor device according to example 1 or 2, wherein the first sensor element and the second sensor element are designed to detect a speed of the ferromagnetic wheel.

Example 4 is a sensor device according to any of the preceding examples, wherein the sensor device and the ferromagnetic wheel are separated by an air gap.

Example 5 is a sensor device according to any of the preceding examples, wherein a main surface of the differential magnetic field sensor facing the magnet is arranged parallel to a plane spanned by the first direction and the second direction.

Example 6 is a sensor device according to any of the preceding examples, wherein the differential magnetic field sensor comprises a Hall sensor that is sensitive in the third direction.

Example 7 is a sensor device according to any of the preceding examples, wherein the magnet has a side edge extending in the second direction, wherein a respective center of the two sensor elements and the side edge intersect in a projection along the third direction.

Example 8 is a sensor device according to example 7, wherein the first sensor element and the second sensor element are at an identical distance from the midpoint of the side edge of the magnet.

Example 9 is a sensor device according to any of the preceding examples, wherein the first sensor element and the second sensor element are exposed to an identical magnetic operating point of the magnet.

Example 10 is a sensor device according to any of the preceding examples, wherein the first sensor element and the second sensor element are arranged in a magnetic field distribution of a magnetic field component of the magnet along the third direction at a local extremum, wherein the magnetic field distribution extends along the first direction.

Example 11 is a sensor device according to any of the preceding examples, the magnetic field sensor is arranged on a leadframe and the connection conductors of the leadframe have a substantially straight course in the first direction.

Example 12 is a sensor device according to any of examples 1 to 4, wherein a main surface of the differential magnetic field sensor facing the magnet is arranged parallel to a plane spanned by the second direction and the third direction.

Example 13 is a sensor device according to example 12, wherein the differential magnetic field sensor comprises xMR sensor elements that are sensitive in the third direction.

Example 14 is a sensor device according to example 12 or 13, wherein the magnet has a cutout.

Example 15 is a sensor device according to any of examples 1 to 13, wherein the magnet comprises a block magnet.

Example 16 is a sensor device according to any of examples 2 to 15, furthermore comprising a third sensor element of the magnetic field sensor, wherein the third sensor element is arranged between the first sensor element and the second sensor element and is designed to detect a direction of rotation of the ferromagnetic wheel.

Example 17 is a method, comprising: providing a magnet having a magnetization in a first direction; and arranging a differential magnetic field sensor having a first sensor element and a second sensor element on the magnet, wherein the sensor elements are spaced apart in a second direction perpendicular to the first direction, wherein the first sensor element and the second sensor element are designed to detect a magnetic field component in a third direction perpendicular to the first direction and perpendicular to the second direction.

Example 18 is a method according to example 17, furthermore comprising arranging the sensor device relative to a ferromagnetic wheel, wherein the ferromagnetic wheel is designed to rotate about a rotation axis extending in the third direction.

Example 19 is a method according to example 17 or 18, furthermore comprising arranging the differential magnetic field sensor on the magnet, wherein a main surface of the differential magnetic field sensor facing the magnet is arranged parallel to a plane spanned by the first direction and the second direction.

Example 20 is a method according to either of examples 17 and 18, furthermore comprising arranging the differential magnetic field sensor on the magnet, wherein a main surface of the differential magnetic field sensor facing the magnet is arranged parallel to a plane spanned by the second direction and the third direction.

Although specific implementations have been illustrated and described herein, it is obvious to a person of average skill in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

The invention claimed is:
1. A sensor device, comprising:
a magnet having a magnetization in a first direction; and a differential magnetic field sensor arranged on the magnet and having a first sensor element and a second sensor element,
  wherein the first sensor element and the second sensor element are spaced apart in a second direction perpendicular to the first direction, and
  wherein the first sensor element and the second sensor element are arranged to be sensitive to a magnetic field component in a third direction perpendicular to the first direction and perpendicular to the second direction.

2. The sensor device as claimed in claim 1, wherein the sensor device is arranged relative to a ferromagnetic wheel, wherein the ferromagnetic wheel is arranged to rotate about a rotation axis extending in the third direction.

3. The sensor device as claimed in claim 2, wherein the first sensor element and the second sensor element are arranged to be sensitive to a speed of the ferromagnetic wheel.

4. The sensor device as claimed in claim 2, wherein the sensor device and the ferromagnetic wheel are separated by an air gap.

5. The sensor device as claimed in claim 1, wherein a main surface of the differential magnetic field sensor facing the magnet is arranged parallel to a plane spanned by the first direction and the second direction.

6. The sensor device as claimed in claim 1, wherein the differential magnetic field sensor comprises a Hall sensor.

7. The sensor device as claimed in claim 1, wherein the magnet has a side edge extending in the second direction,
  wherein a respective center of the first sensor element and the second sensor element and the side edge intersect in a projection along the third direction.

8. The sensor device as claimed in claim 7, wherein the first sensor element and the second sensor element are at an identical distance from a midpoint of the side edge of the magnet.

9. The sensor device as claimed in claim 1, wherein the first sensor element and the second sensor element are exposed to an identical magnetic operating point of the magnet.

10. The sensor device as claimed in claim 1, wherein the first sensor element and the second sensor element are arranged in a magnetic field distribution of the magnetic field component in the third direction at a local extremum,
  wherein the magnetic field distribution extends along the first direction.

11. The sensor device as claimed in claim 1, wherein the differential magnetic field sensor is arranged on a leadframe and connection conductors of the leadframe have a substantially straight course in the first direction.

12. The sensor device as claimed in claim 1, wherein a main surface of the differential magnetic field sensor facing the magnet is arranged parallel to a plane spanned by the second direction and the third direction.

13. The sensor device as claimed in claim 1, wherein the differential magnetic field sensor comprises xMR sensor elements.

14. The sensor device as claimed in claim 1, wherein the magnet has a cutout.

15. The sensor device as claimed in claim 1, wherein the magnet comprises a block magnet.

16. The sensor device as claimed in claim 2, further comprising:
  a third sensor element of the differential magnetic field sensor,
    wherein the third sensor element is arranged between the first sensor element and the second sensor element and is arranged to be sensitive to a direction of rotation of the ferromagnetic wheel.

17. A method, comprising:
providing a magnet having a magnetization in a first direction; and
arranging a differential magnetic field sensor having a first sensor element and a second sensor element on the magnet,
  wherein the first sensor element and the second sensor element are spaced apart in a second direction perpendicular to the first direction, and
  wherein the first sensor element and the second sensor element are arranged to be sensitive to a magnetic field component in a third direction perpendicular to the first direction and perpendicular to the second direction.

18. The method as claimed in claim 17, further comprising:
  arranging the magnet and/or the differential magnetic field sensor relative to a ferromagnetic wheel,
    wherein the ferromagnetic wheel is arranged to rotate about a rotation axis extending in the third direction.

19. The method as claimed in claim 17, further comprising:
  arranging the differential magnetic field sensor on the magnet,
    wherein a main surface of the differential magnetic field sensor facing the magnet is arranged parallel to a plane spanned by the first direction and the second direction.

20. The method as claimed in claim 17, further comprising:
  arranging the differential magnetic field sensor on the magnet,
    wherein a main surface of the differential magnetic field sensor facing the magnet is arranged parallel to a plane spanned by the second direction and the third direction.

* * * * *